United States Patent
Zheng et al.

(10) Patent No.: US 6,963,255 B2
(45) Date of Patent: **\*Nov. 8, 2005**

(54) POWER SPLITTER

(76) Inventors: Wei Ping Zheng, 1964 E. 29$^{th}$ St., Brooklyn, NY (US) 11229; Igor Lumelskiy, 2166 E. 15th St., Brooklyn, NY (US) 11229; Radha Setty, 32 Monroe Pl., Staten Island, NY (US) 10314

( * ) Notice: Subject to any disclaimer, the term of this patent is extended or adjusted under 35 U.S.C. 154(b) by 91 days.

This patent is subject to a terminal disclaimer.

(21) Appl. No.: 10/050,700

(22) Filed: Jan. 18, 2002

(65) Prior Publication Data

US 2002/0186096 A1 Dec. 12, 2002

Related U.S. Application Data

(60) Provisional application No. 60/297,597, filed on Jun. 12, 2001.

(51) Int. Cl.$^7$ .................................................. H03H 7/38
(52) U.S. Cl. ................... 333/131; 333/109; 333/112; 333/115; 333/118; 333/119; 333/127
(58) Field of Search ................................ 333/124, 131, 333/184, 185, 119, 118, 109, 112, 115, 127; 336/170; H03H 7/48

(56) References Cited

U.S. PATENT DOCUMENTS 4,516,092 A * 5/1985 Rosenberg ................... 333/184
5,097,234 A * 3/1992 Andresen ................. 333/131 X
5,705,962 A * 1/1998 Fleeger et al. .............. 333/136
5,726,612 A * 3/1998 Mandai et al. .............. 333/184
6,252,761 B1 * 6/2001 Branchevsky ............ 361/321.2
6,470,545 B1 * 10/2002 Branchevsky .............. 29/25.42
6,542,047 B2 * 4/2003 Chen et al. ................. 333/119

FOREIGN PATENT DOCUMENTS

JP          62-147808      * 7/1987      ............ H03H/7/48

* cited by examiner

Primary Examiner—Robert Pascal
Assistant Examiner—Kimberly Glenn
(74) Attorney, Agent, or Firm—Kevin Redmond

(57) ABSTRACT

A power splitter that has a small package size and repeatable electrical characteristics. The power splitter includes a low temperature co-fired ceramic (LTCC) substrate with several layers. Electrical components such as resistors and capacitors are integrated within the LTCC substrate. A transformer is attached to the upper surface of the LTCC substrate and is electrically connected to the resistors and capacitors. The transformer provides impedance matching and dividing functions. The LTCC substrate has electrically conductive vias extending therethrough. The vias are used to connect the power splitter to an external printed circuit board. The vias are also used to make electrical connections between the layers of the LTCC substrate.

22 Claims, 14 Drawing Sheets

ELECTRICAL SPECIFICATIONS

| FREQ. RANGE (MHz) fl-fu | ISOLATION (db) | | | | | | INSERTION LOSS (dB) ABOVE 3.0 dB | | | | | | PHASE UNBALANCE (Degrees) | | | | AMPLITUDE UNBALANCE (db) | | | |
|---|---|---|---|---|---|---|---|---|---|---|---|---|---|---|---|---|---|---|---|---|
| | L | | M | | U | | L | | M | | U | | L | | M | U | L | M | | U |
| | Typ.Min. | | Typ.Min. | | Typ.Min. | | Typ.Max. | | Typ.Max. | | Typ.Max. | | Max. | | Max. | Max. | Max. | Max. | | Max. |
| 5-1000 | 29 | 20 | 25 | 18 | 21 | 16 | 0.3 | 0.7 | 0.3 | 0.8 | 0.5 | 1.4 | 3 | | 3 | 5 | 0.6 | 0.5 | | 0.5 |

L=LOW RANGE [$f_L$ to $f_L$]    M=MIDRANGE [$10f_L$ to $f_u/2$]    U=UPPER RANGE [$f_L/2$ to $f_u$]

Fig. 13

POWER SPLITTER

CROSS REFERENCE TO CO-PENDING AND RELATED APPLICATIONS

This application is a continuation of U.S. patent application Ser. No. 10/050,700, filed on Jan. 18, 2002.

This application claims priority to U.S. provisional patent application Ser. No. 60/297,597 filed on Jun. 12, 2001 and entitled, "Miniature Power Splitter", which is herein incorporated by reference in entirety.

BACKGROUND OF THE INVENTION

1. Field of the Invention

This invention relates to power splitters in general and more particularly to a power splitter having a small package size.

2. Description of the Prior Art

Power splitters operating at frequencies below 1 GHz have been made with ferrite transformers along with appropriate resistors and capacitors arranged around the ferrite transformer. These splitters provide multi-decade bandwidth. The power splitter components are packaged on a printed circuit board. In some applications, printed circuit board space can be extremely limited with additional space just not available. In some applications, it is desirable to build multiple output-port splitters such as 4-way and 8-way by cascading the splitters. Unfortunately, placing resistors and capacitors beside each transformer complicates the assembly program followed by the automated pick and place surface mount assembly equipment. This leads to lower production by the assembly machinery.

While power splitters have been used, they have suffered from taking up excessive printed circuit board space and in having difficulty being cascaded. A current unmet need exists for a power splitter that takes up less printed circuit board space and that can be easily assembled.

SUMMARY OF THE INVENTION

It is a feature of the invention to provide a power splitter having a small package size that has repeatable electrical characteristics.

Another feature of the invention is to provide a power splitter that includes a low temperature co-fired ceramic (LTCC) substrate. The LTCC substrate has several layers. Electrical components such as resistors and capacitors are integrated internal within the LTCC substrate. A transformer is attached to the upper layer of the LTCC substrate and is electrically connected to the resistors and capacitors. The transformer provides impedance matching and dividing functions. The LTCC substrate has electrically conductive vias extending therethrough. The vias are used to make electrical connections between layers of the LTCC substrate.

Another feature of the invention is to provide a power splitter that takes up less printed circuit board space and has improved electrical repeatability.

A further object of the invention is to provide a method of manufacturing a miniature power splitter.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention.

BRIEF DESCRIPTION OF THE DRAWINGS

In order that the invention may be more fully understood, it will now be described, by way of example, with reference to the accompanying drawings in which:

FIG. 13 is a table showing electrical specifications of a power splitter built in accordance with the present invention.

It is noted that the drawings of the invention are not to scale. In the drawings, like numbering represents like elements between the drawings.

DETAILED DESCRIPTION OF THE PREFERRED EMBODIMENT

Figure 1:
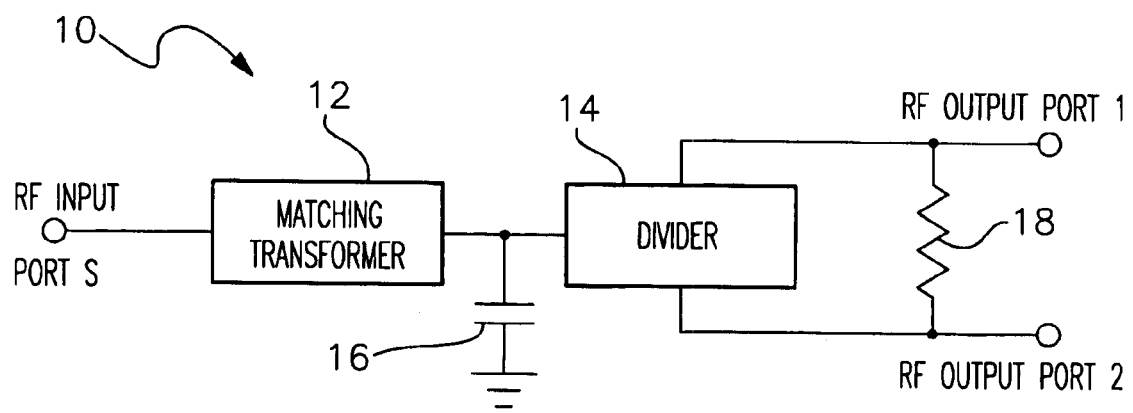
FIG. 1 is a block diagram of a power splitter.

Referring to FIG. 1, a block diagram of a power splitter 10 is shown. Power splitter 10 has a RF input port S, an input matching transformer 12, a divider section 14, a capacitor 16, a resistor 18 and a pair of RF output ports 1 and 2. In a 50 ohm system, the impedance at the input of the divider is close to 25 ohms. The matching transformer converts this to 50 ohms at the RF input to provide a matching impedance. Normally, capacitor 16 is required to match the reactive part of the impedance. The resistor 18 plays a critical role in providing isolation between the two RF output ports 1 and 2.

Figure 3:
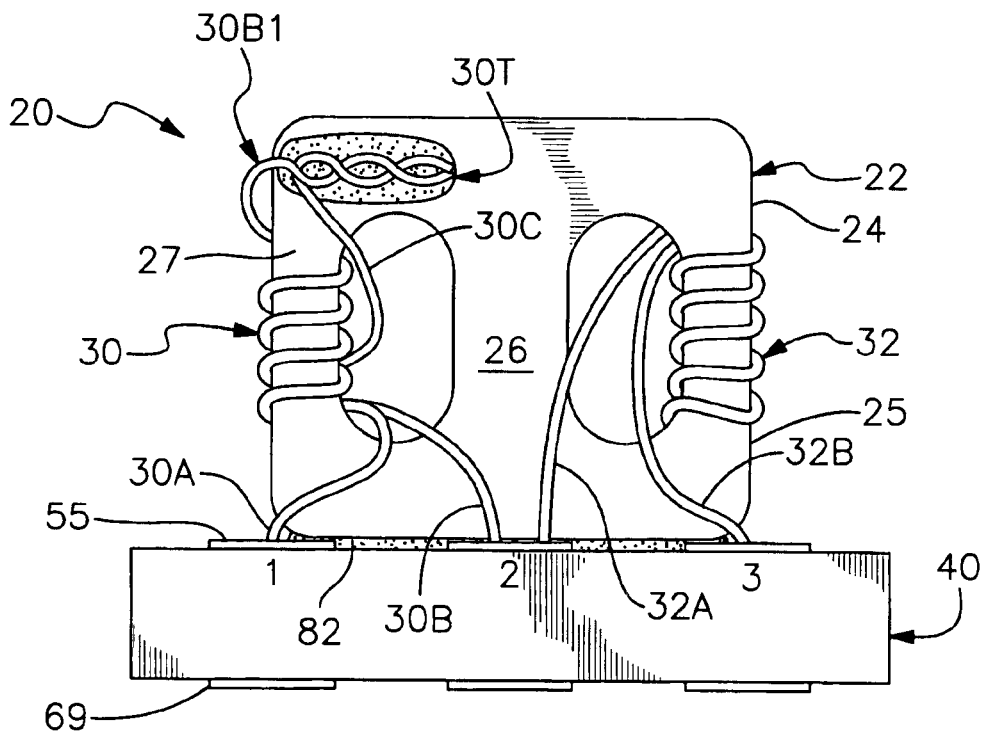
FIG. 3 is an assembled side view of FIG. 2.
Figure 2:
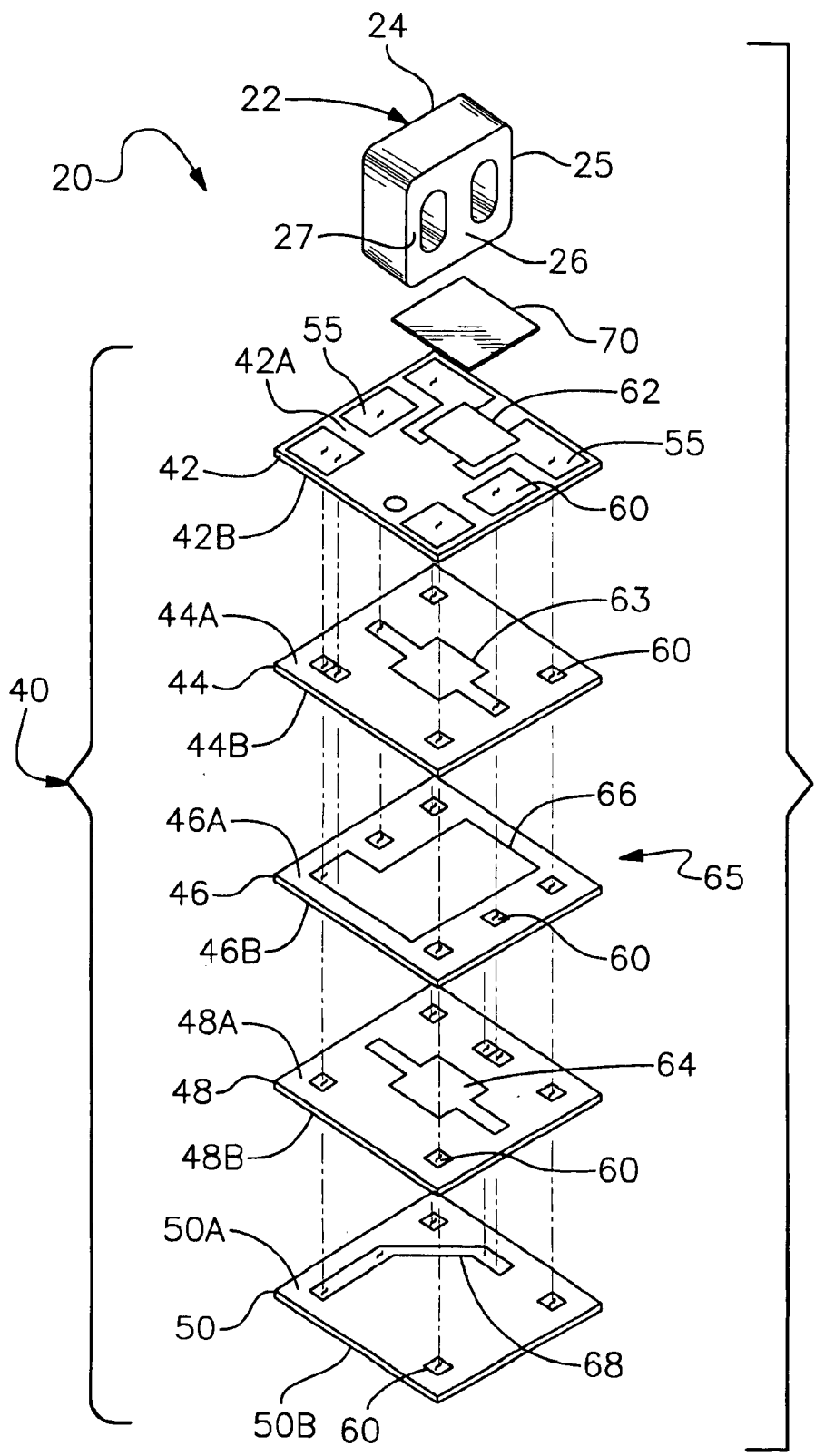
FIG. 2 is an exploded perspective view of the preferred embodiment of the present invention.
Figure 4:
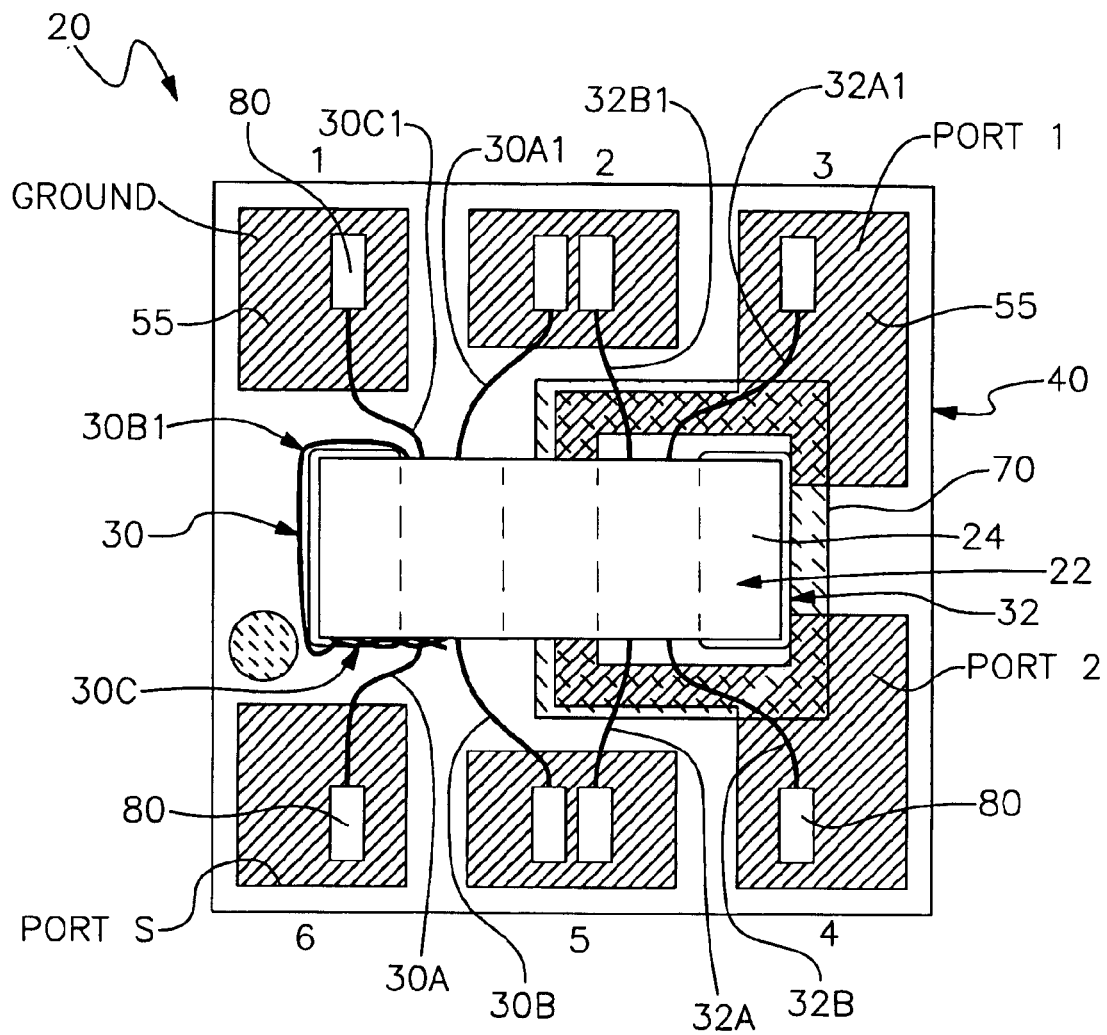
FIG. 4 is an assembled top view of FIG. 2.

Referring to FIGS. 2, 3 and 4, power splitter 20 is shown. Power splitter 20 has a transformer 22. Transformer 22 has a ferrite binocular core 24 with three legs 25, 26 and 27. A winding 30 is wound around leg 27. Winding 32 is wound around leg 25. Winding 30 has wires 30A, 30B and 30C. The transformer 30T is soldered to make continuity with wires 30B and 30C Winding 32 has wires 32A and 32B. Transformer 22 performs the power splitting and matching functions.

Transformer 22 is mounted to a low temperature co-fired ceramic (LTCC) structure or substrate 40 using an epoxy 82. LTCC substrate 40 is comprised of multiple layers of LTCC material. Planar layers 42, 44, 46, 48 and 50 are all stacked on top of each other and form a unitary structure 40 after firing in an oven. LTCC layers 42–50 are commercially available in the form of a green unfired tape from Dupont Corporation. Each of the layers has a top surface, 42A, 44A, 46A, 48A and 50A. Similarly, each of the layers has a bottom surface, 42B, 44B, 46B, 48B and 50B. The layers have several circuit features that are patterned on the top surfaces. Multiple vias 60 extend through each of the layers. Vias 60 are formed from an electrically conductive material and electrically connect one layer to another layer.

Layer 42 has several circuit features that are patterned on surface 42A. Surface 42A has several terminals 55 and a resistor 62. One of the terminals 55 forms RF input port S. Two of the terminals 55 form RF output ports 1 and 2. One more terminal 55 forms RF ground. The terminals are electrically connected to vias 60. The resistor 62 has a protective overglaze 70 to protect the resistor from abrasion and shorting. Layer 44 has an upper capacitor electrode 63 formed on surface 44A. The upper electrode 63 is connected on two sides to a via 60. Layer 46 has a ground plane 66 formed on surface 46A. The ground plane 66 is connected on two sides to a via 60. Layer 48 has a lower capacitor electrode 64 formed on surface 48A. The lower electrode 64 is connected on two sides to a via 60. The upper and lower electrodes and the insulative LTCC layers in between form a capacitor 65. Layer 50 has a circuit line 68 formed on surface 50A and conductive pad 69 patterned on the surface 50B (not shown on FIG. 2) The circuit line 68 is connected at the ends and the middle to vias 60.

The circuit features are formed by screening a thick film paste material and firing in an oven. This process is well known in the art. First, the LTCC layers have via holes punched, the vias are then filled with a conductive material. Next, the circuit features are screened onto the layers. The terminals, circuit lines and capacitor electrodes are formed with a conductive material. The layers are then aligned and stacked on top of each other to form LTCC substrate 40. The LTCC structure 40 is then fired in an oven at approximately 900 degrees centigrade to form a unitary piece. The resistor is formed with a resistive material, fired and trimmed to a desired value. An insulative overglaze is screened over the resistor and fired. Next, the transformer 22 is glued above surface 42A using an epoxy 82. Wires 30A, 30B, 30A1, and 30C1, and 32A, 32B, 32A1 and 32B1 are welded to terminals 55 using welds 80.

The power splitter 22 would be mounted to a printed circuit board. The conductive pads 69 on the bottom of surface 50B would be attached to the printed circuit board using a reflowed solder paste.

The present invention has several advantages. Since, the resistor 62 and capacitor 65 are integrated into the LTCC structure, they do not have to be mounted separately on the printed circuit board. This provides a savings of space on the printed circuit board and allows for a faster assembly process at lower cost.

Figure 5:
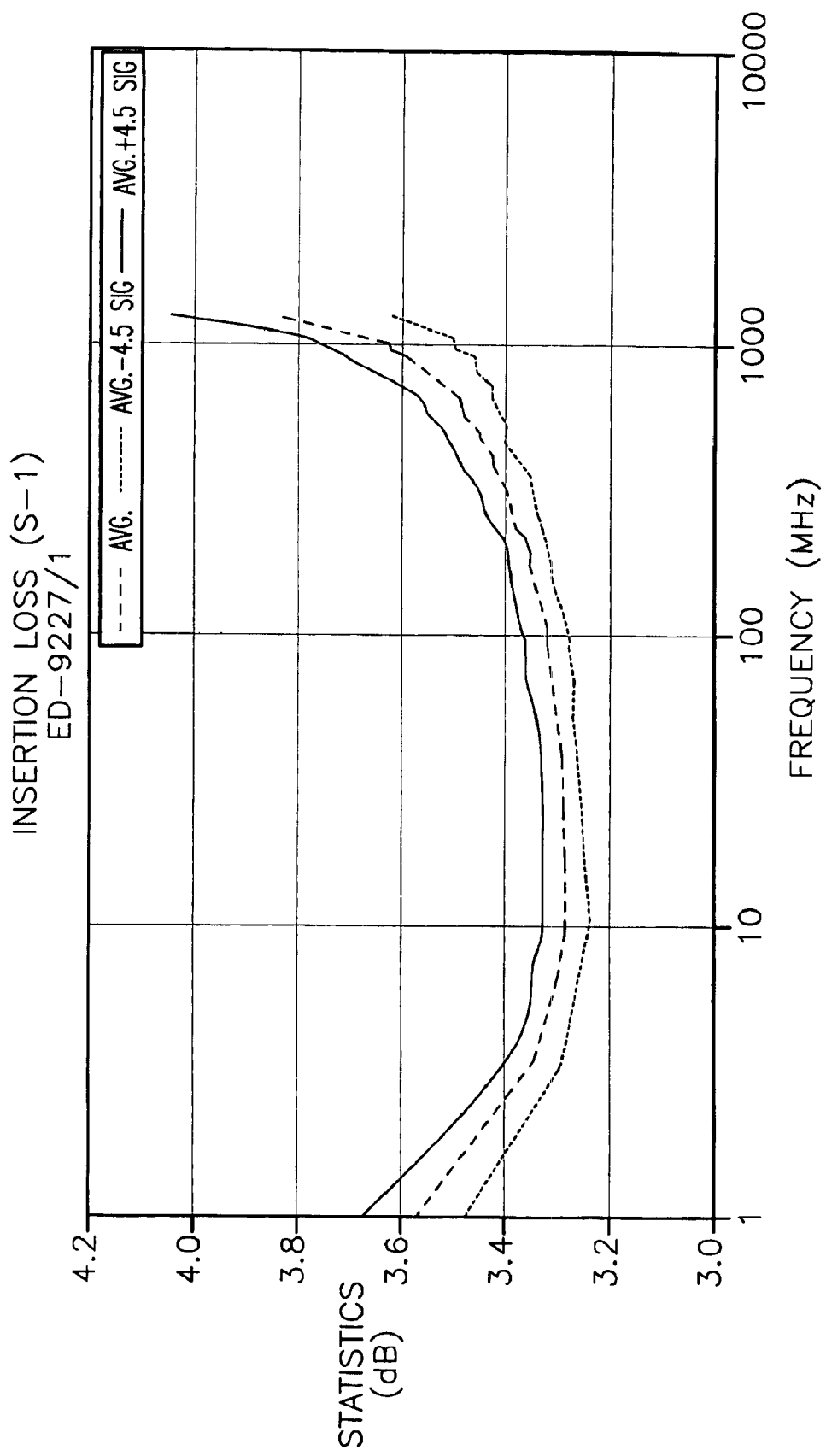
FIG. 5 is a graph showing S1 insertion loss of the power splitter.
Figure 6:
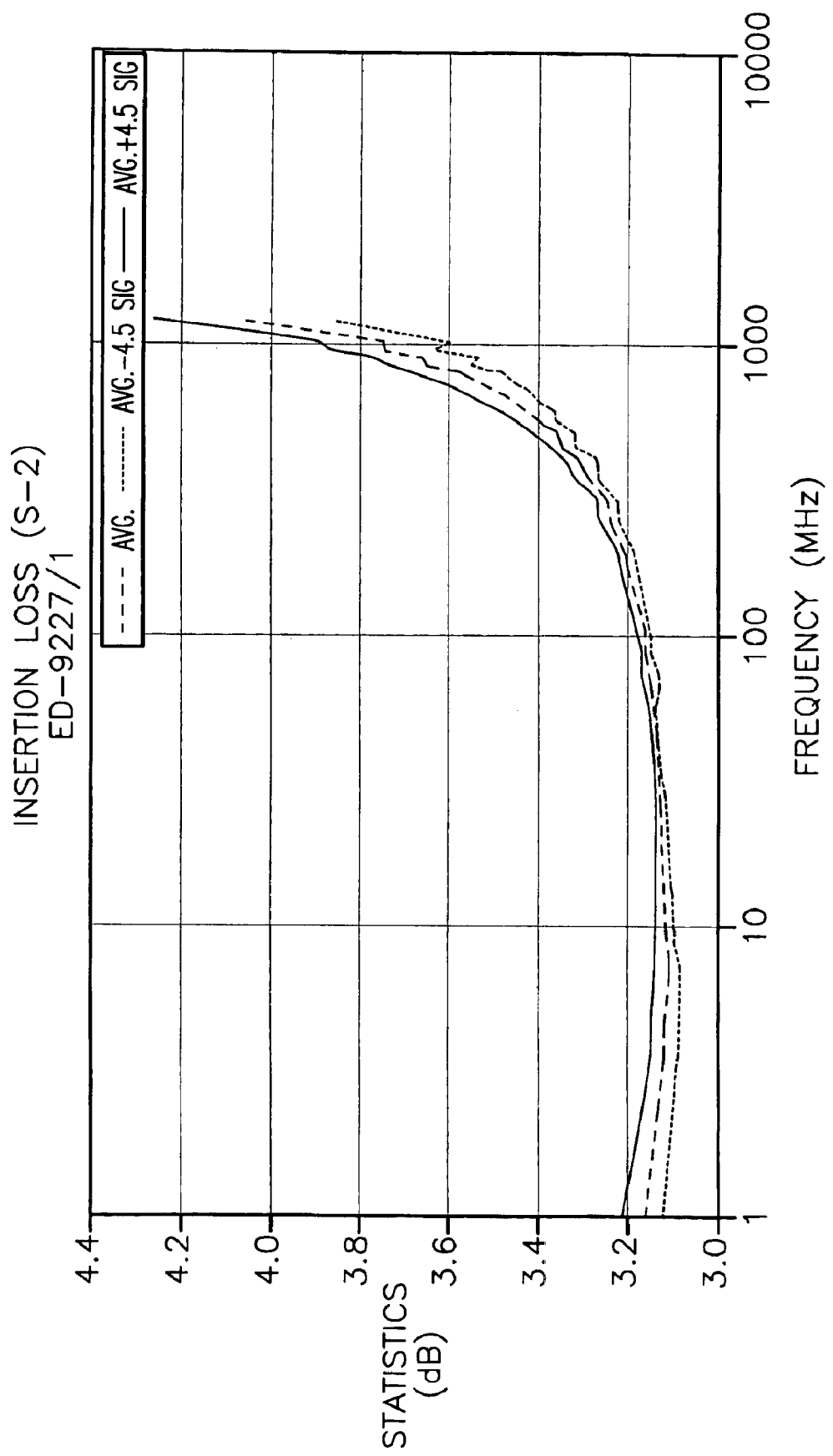
FIG. 6 is a graph showing S2 insertion loss of the power splitter.
Figure 7:
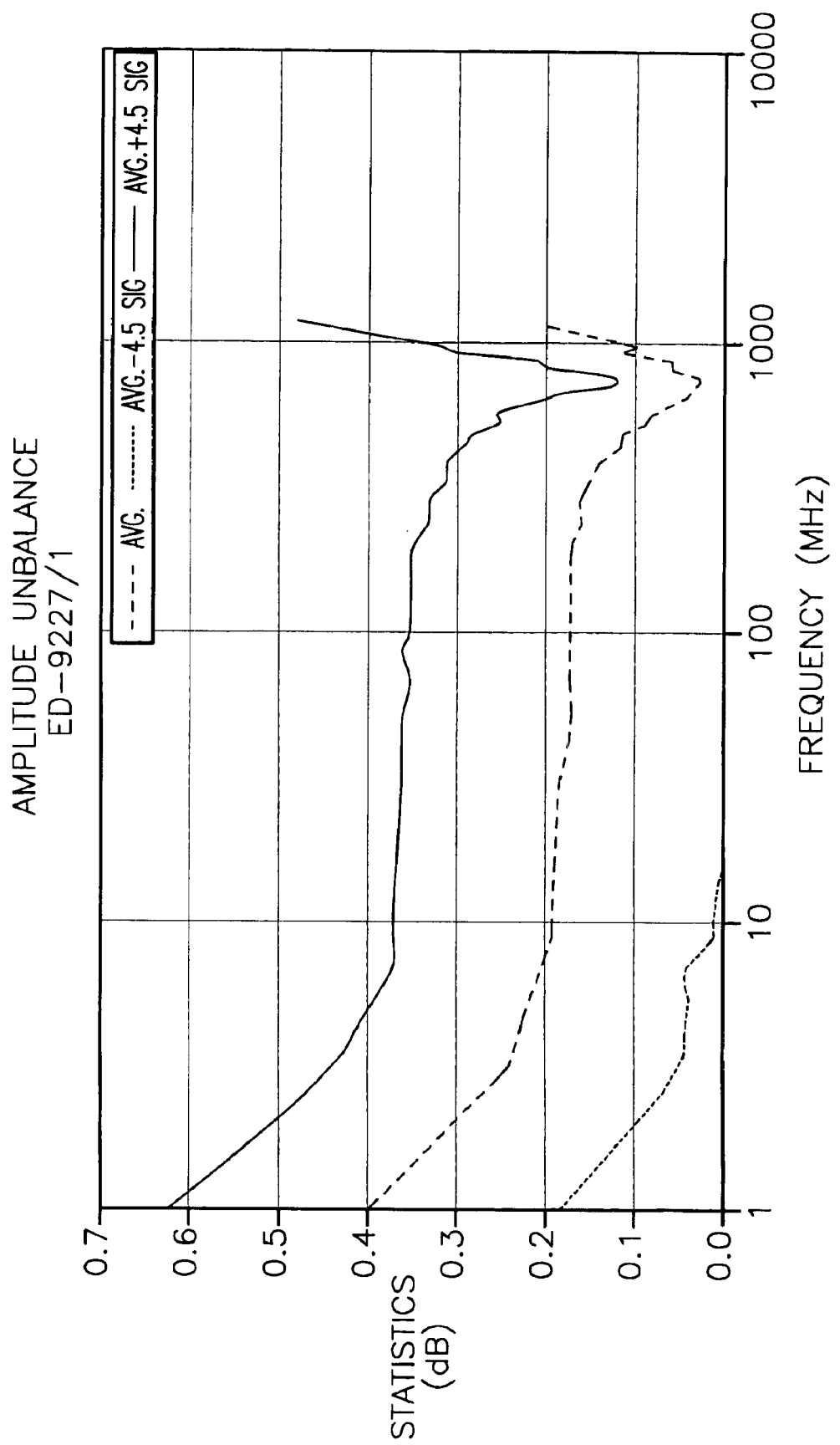
FIG. 7 is a graph showing amplitude unbalance of the power splitter.
Figure 8:
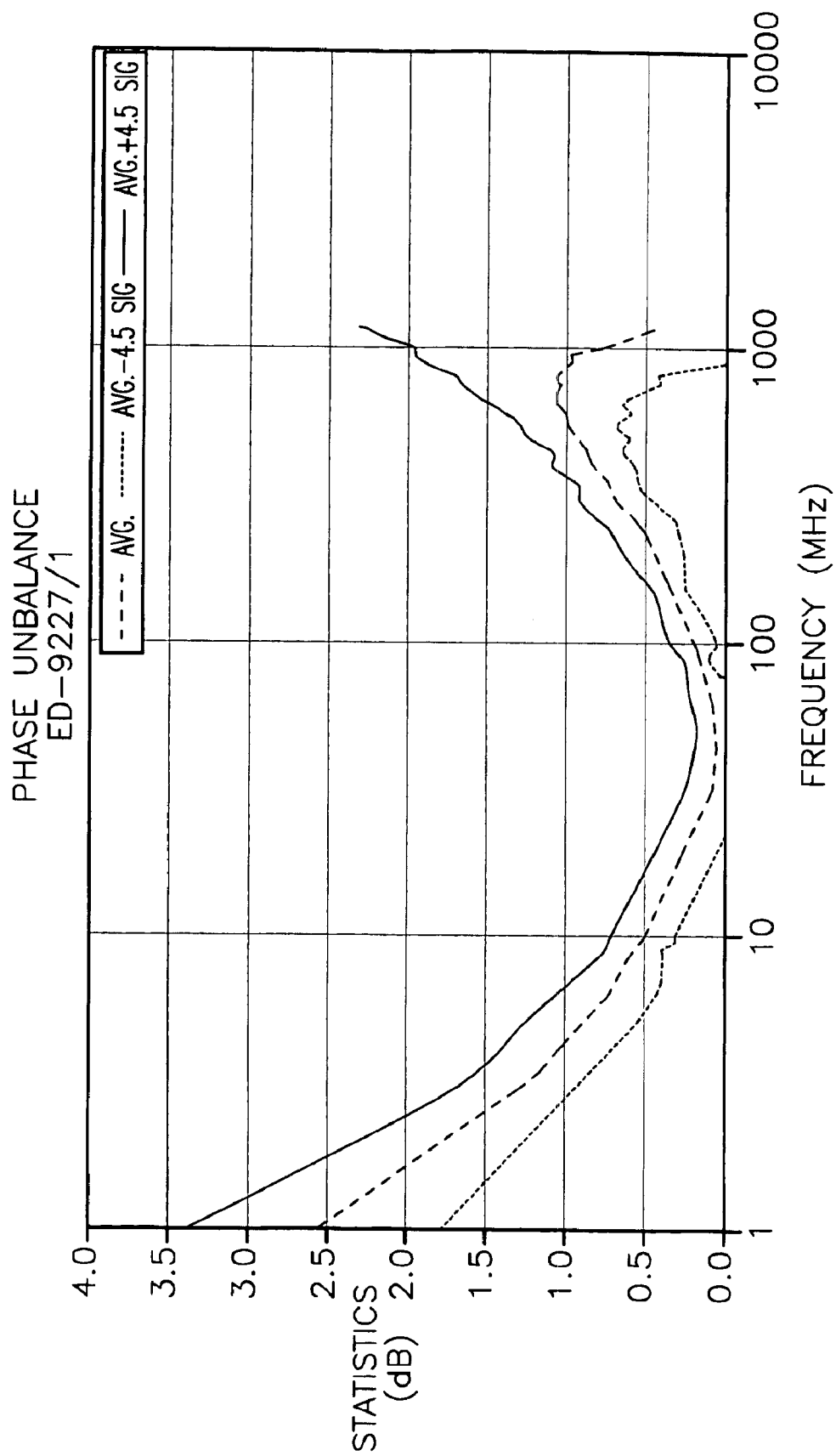
FIG. 8 is a graph showing phase unbalance of the power splitter.
Figure 9:
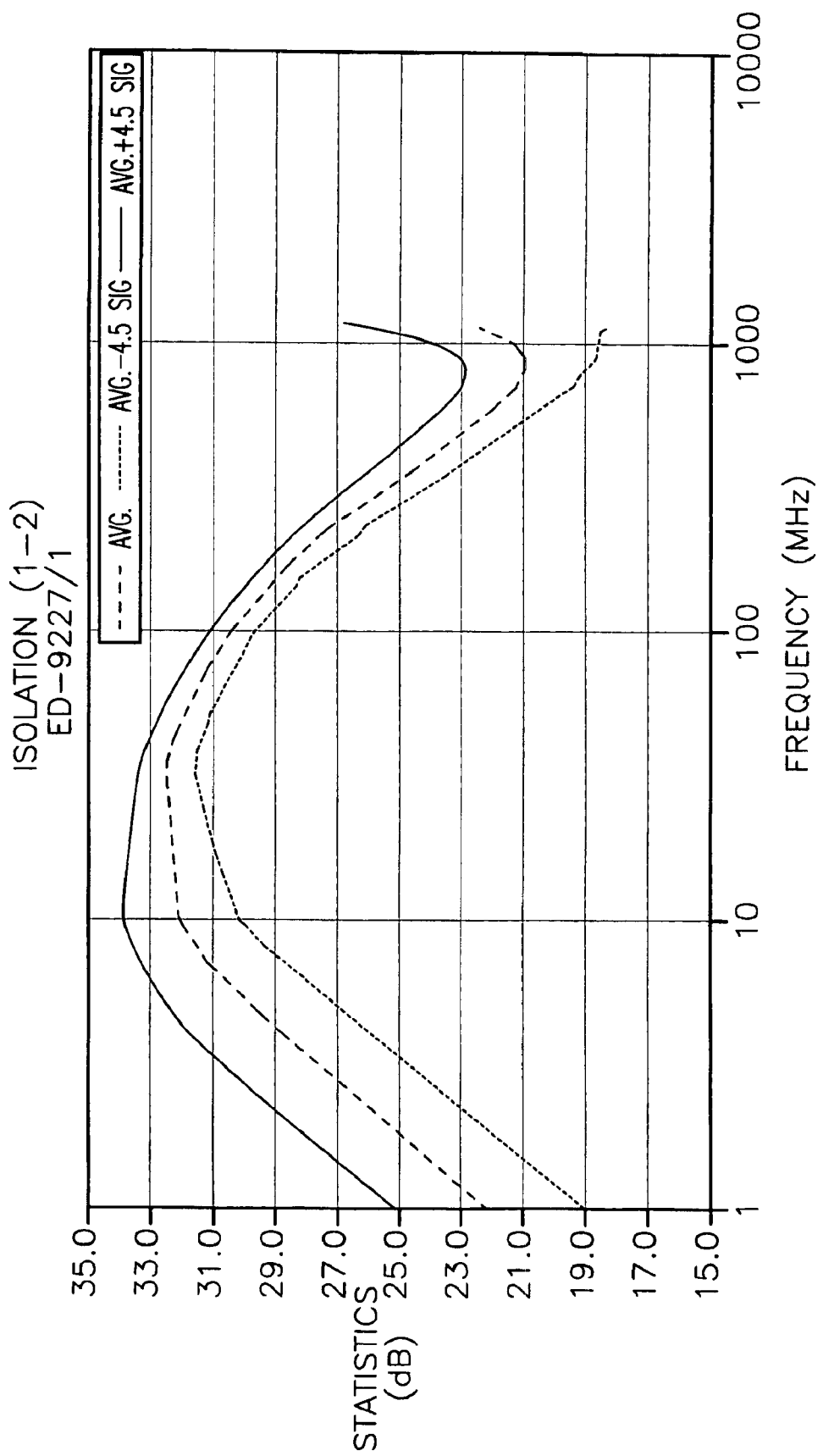
FIG. 9 is a graph showing isolation of the power splitter.

Repeatability of electrical performance is a prime concern for electrical design engineers. Fabricating the power splitter using an LTCC process results in a more uniform electrical performance in the resulting power splitter. Referring to FIGS. 5 and 6, a graph showing S1 and S2 insertion loss for several power splitters is shown for frequencies form 1 to 1000 MHz. Each graph has three curves showing the mean and standard deviation. The middle curve shows the mean average, the top curve shows the mean plus 4.5 sigma and the bottom the mean minus 4.5 sigma. The power splitter 20 has a very small standard deviation (0.02 dB). FIG. 7 shows a graph of amplitude imbalance of the power splitter. Amplitude imbalance is the difference of output power between RF output ports 1 and 2. The unbalance is typically 0.1 dB with a standard deviation of 0.04 dB. FIG. 8 is a graph showing the phase unbalance of the power splitter. The phase unbalance has a standard deviation of 0.1 degree. FIG. 9 shows a graph of isolation of the power splitter between the RF output ports 1 and 2. The isolation is about 20 dB up to 1000 MHz. This isolation measurement is very sensitive to parasitic variations due to assembly differences. The standard deviation of the isolation shown in FIG. 9 is about 0.5 dB which is very low when compared to the power splitters of the prior art.

Figure 10:
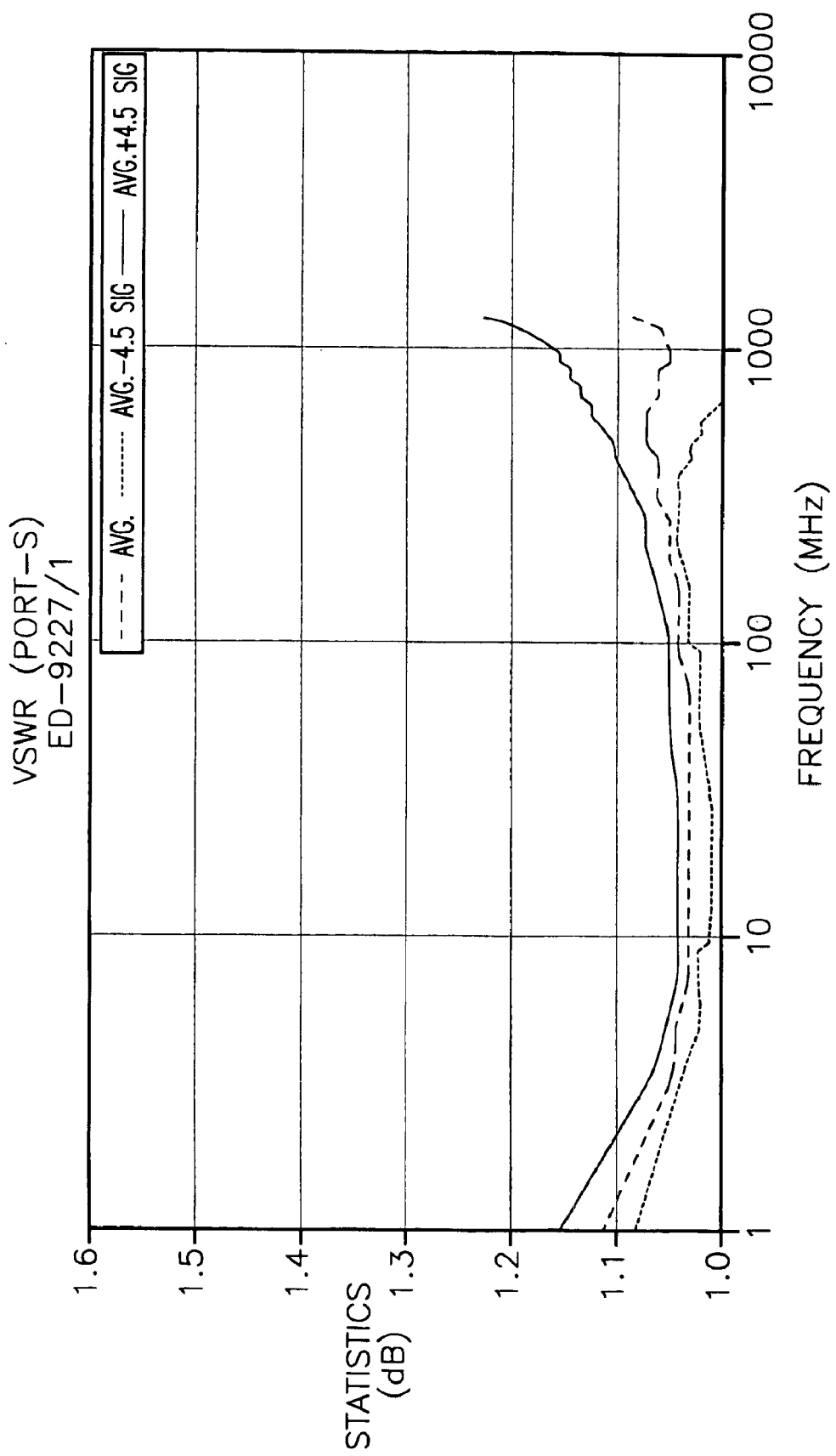
FIG. 10 is a graph showing VSWR at port S of the power splitter.
Figure 11:
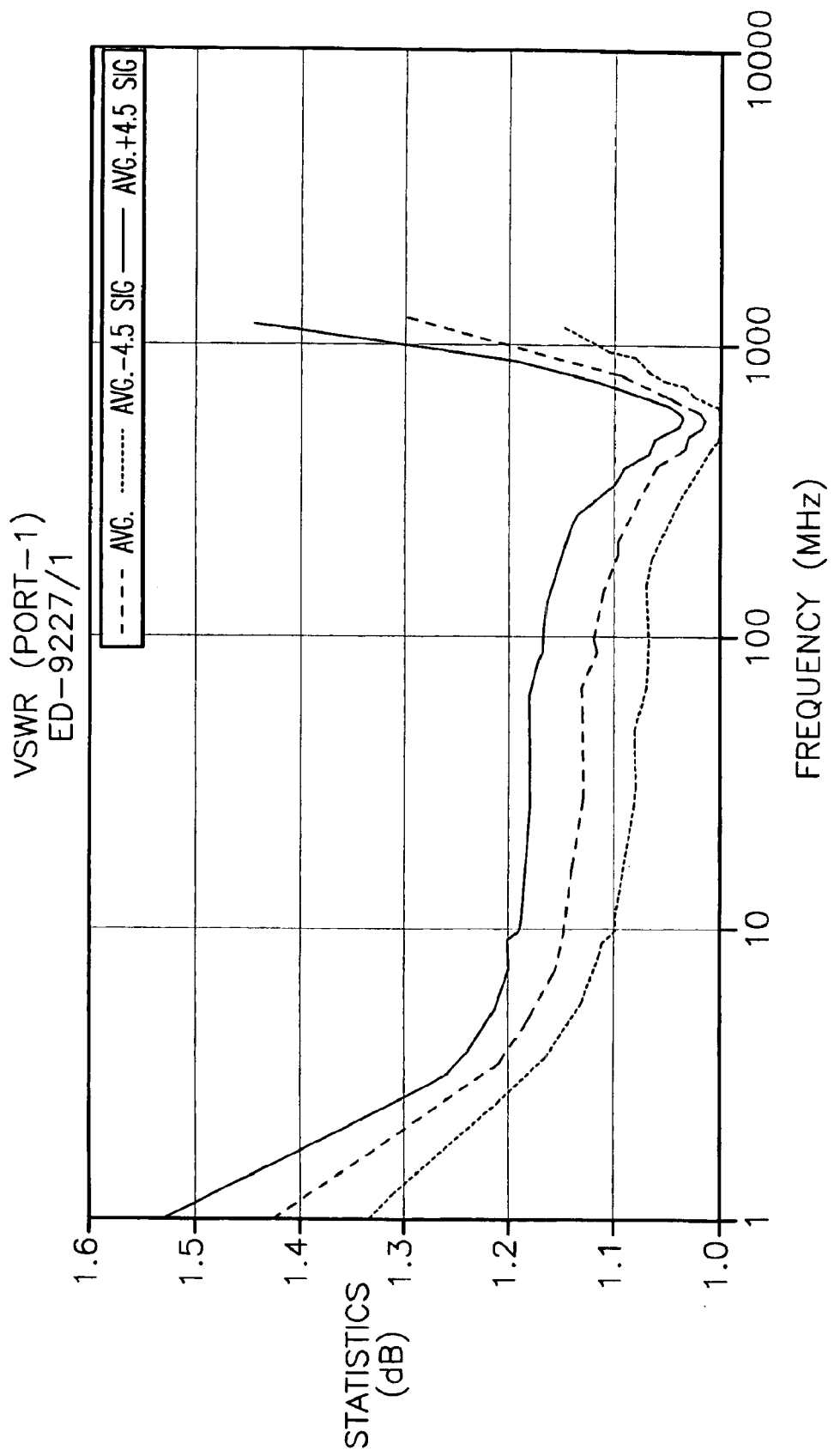
FIG. 11 is a graph showing VSWR at port 1 of the power splitter.
Figure 12:
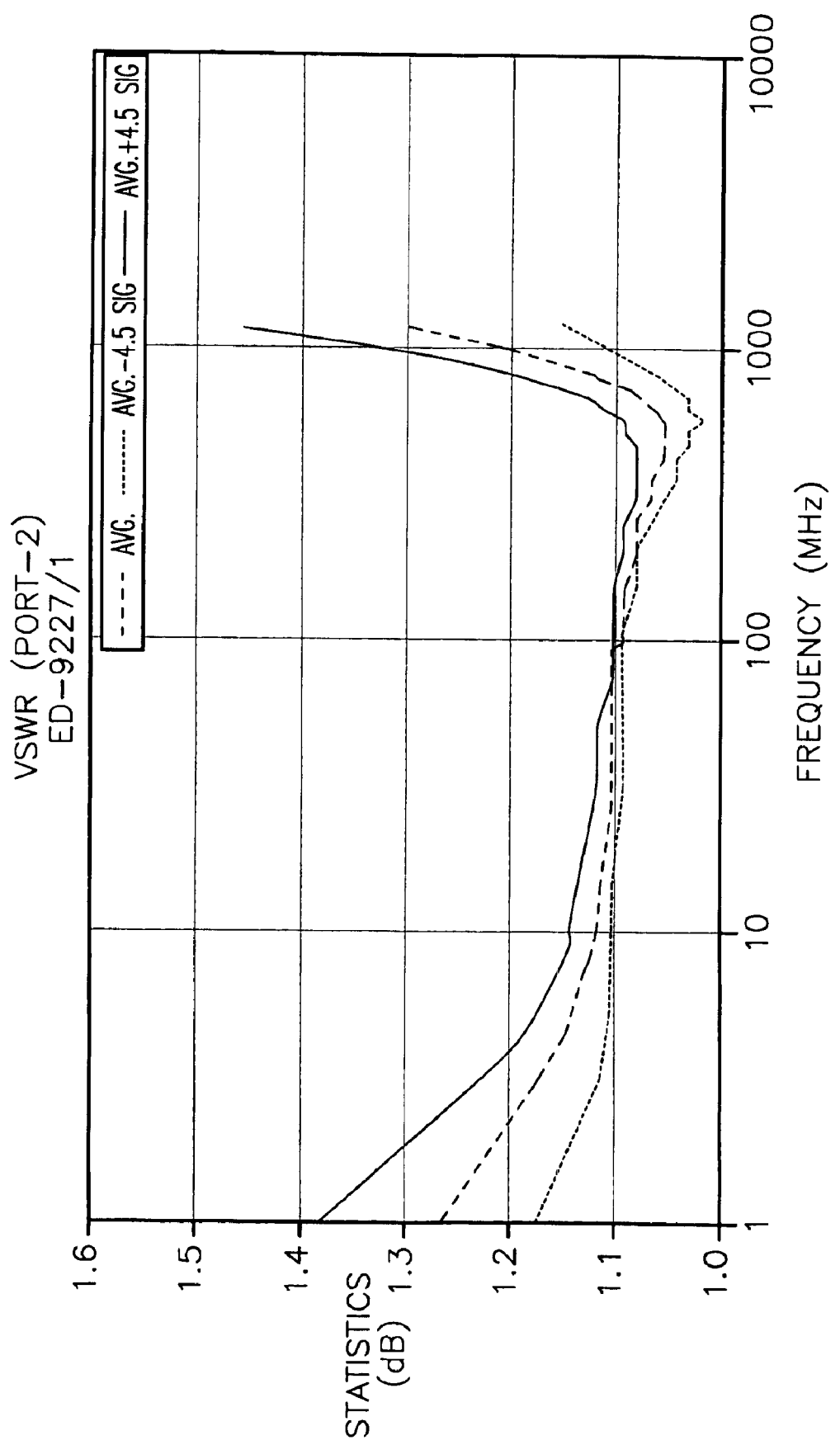
FIG. 12 is a graph showing VSWR at port 2 of the power splitter.

FIG. 10 is a graph showing VSWR at the input port S of the power splitter. FIG. 11 is a graph showing VSWR at port 1 of the power splitter. FIG. 12 is a graph showing VSWR at port 2 of the power splitter. The VSWR match is very good with a typical value of 1.15:1. The power splitter 20 is designed to operate over 5–1000 MHz and can be used over the frequency range from 1–1200 MHz. Power splitter 20 can handle 0.5 watt power as a splitter and 0.125 watt power as a combiner. FIG. 13 is a table showing electrical specifications of the power splitter over a frequency range of 5–1000 Mhz and over operating temperature from −40° C. to 85° C.

Figure 14:
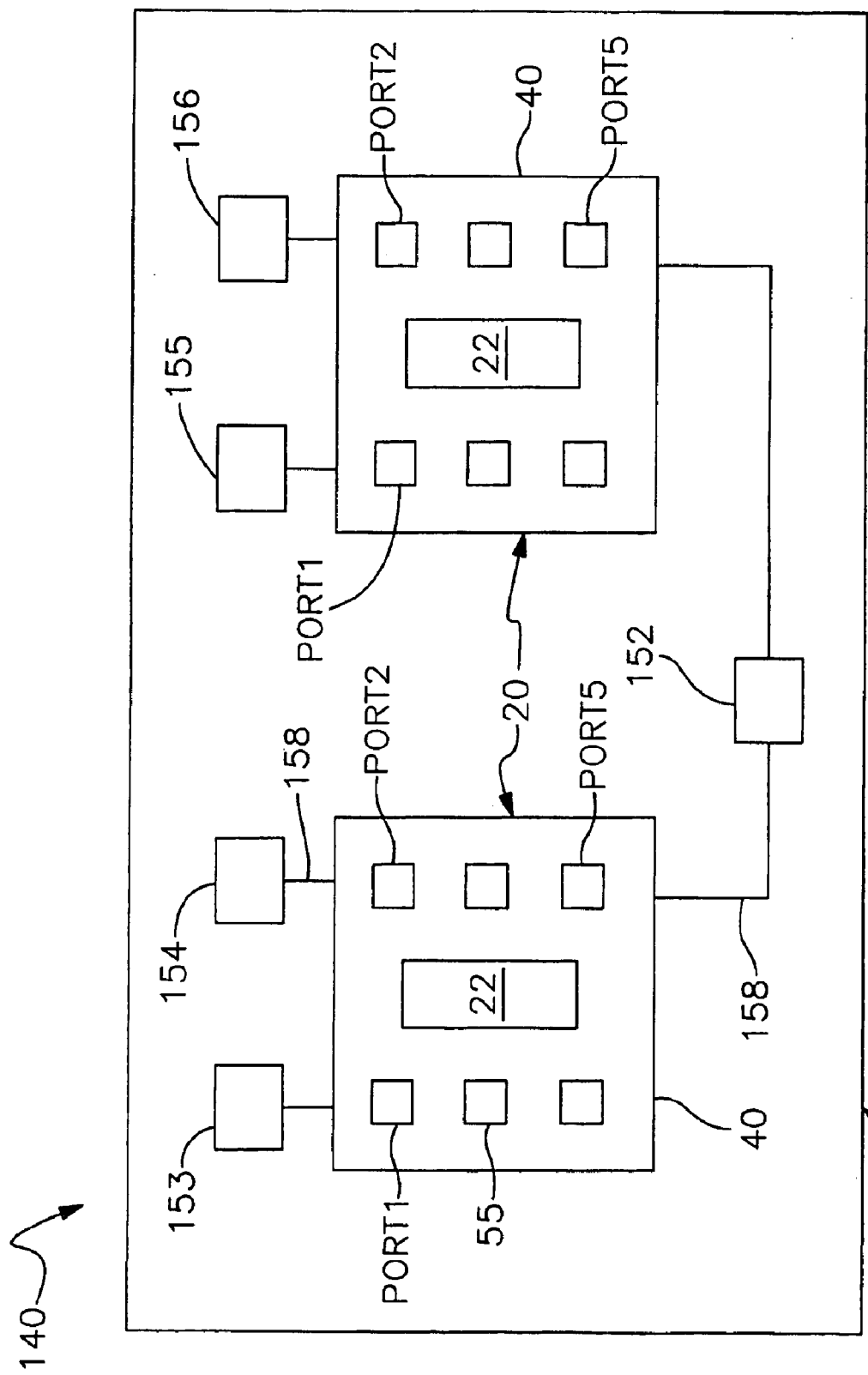
FIG. 14 shows three 2 way splitters cascaded to form a 4 way splitter.
Figure 15:
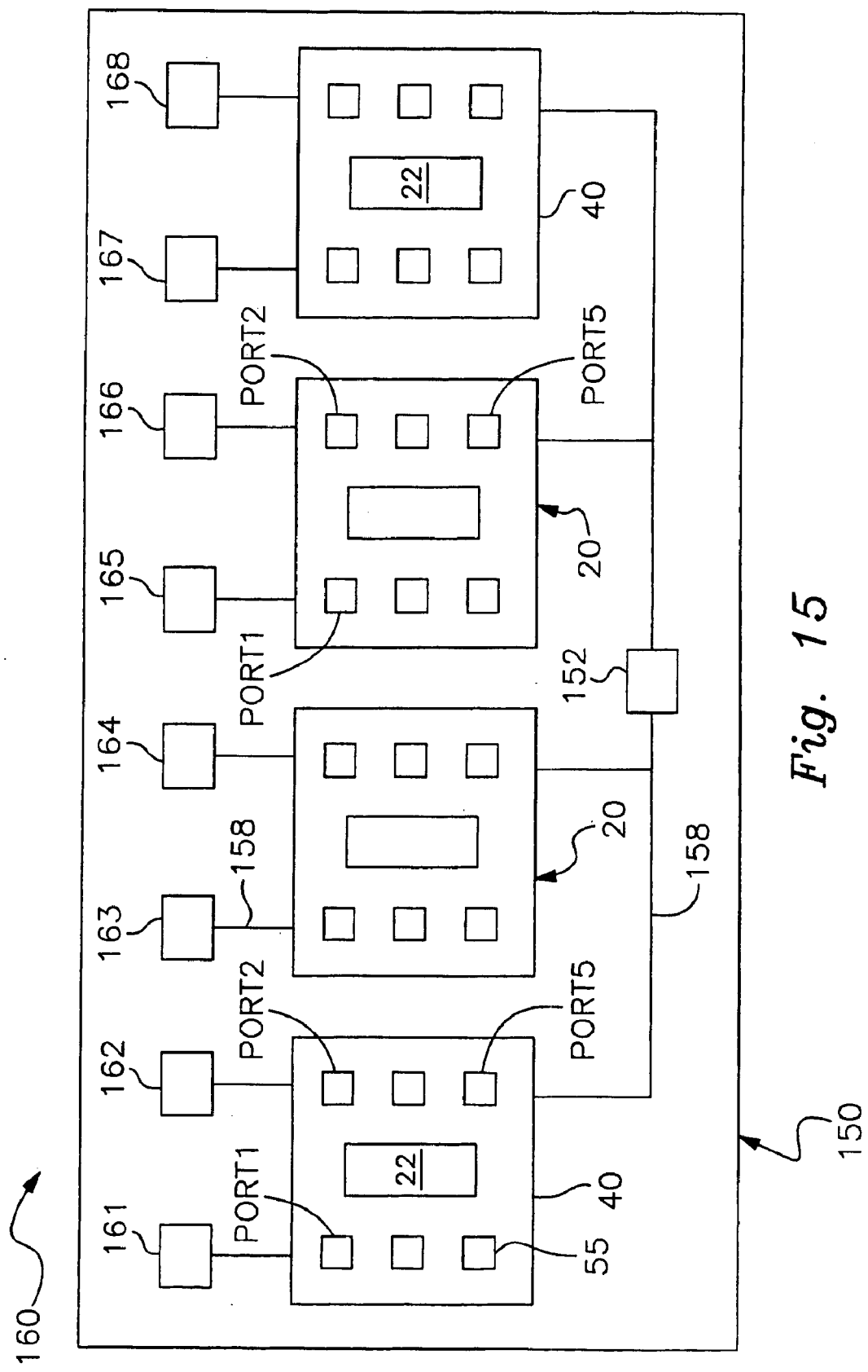
FIG. 15 shows seven 2 way splitters cascaded to form an 8-way splitter.

Power splitter 20 can be used to make 4-way and 8-way splitters as well as higher order splitters. Since power splitter 20 is a 2-way power splitter, the 2-way splitter is cascaded to form 4-way and 8-way power splitters. Multiple power splitters 20 are mounted side by side on a printed circuit board. There are several advantages of cascading power splitter 20. First, the small size of power splitter 20 makes cascading practical because the higher order splitter is still very small. It is still possible to fit multiple splitters 20 used in 4 & 8-way splitters in a small space. Second using the same 2-way splitter repeatedly in high volume reduces cost because the same splitter parts can be bought in large volume and at reduced cost. Referring to FIGS. 14 and 15, a 4-way and 8-way splitter is shown. FIG. 14 shows three 2 way splitters 20 cascaded to form 4-way splitter 140. Splitters 20 with substrate 40 are mounted side by side on a printed circuit board 150. An input port 152 is commoned through circuit line 158 to the input port 5 of splitters 20. The output ports 1 and 2 of splitters 20 are connected through other circuit lines 158 to the inputs (port 5) of the other two splitters. The outputs of the two splitters (port 1, port 2) are connected through circuit lines 158 to four output ports 153, 154, 155 and 156. FIG. 15 shows seven 2 way splitters 20, cascaded to form 8-way splitter 160. 8-way splitter 160 has two 4-way splitters 140 connected by an additional splitter. Splitters 20 with substrate 40 are mounted side by side on printed circuit board 150. An input port 152 is connected to the input (port 5) of a splitter 20 which in turn is connected to two 4-way splitters 140 through circuit line 158. The outputs 153, 154, 155 and 156 are commoned through circuit line 158 to input port 5 of splitters 20. The output ports 1 and 2 of splitters 20 are connected through other circuit lines 158 to four output ports 161, 162, 163, 164, 165, 166,167 and 168.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A power splitter comprising:
   a) a substrate having a top layer, a bottom layer and a plurality of inner layers;
   b) a resistor and a plurality of terminals formed on the top layer, and a plurality of conductive pads formed on the bottom layer;
   c) a capacitor formed between one of the inner layers and a ground plane formed on one of the inner layers;
   d) a binocular core transformer attached to the top layer and electrically connected to the terminals, the transformer providing impedance matching and dividing;
   e) a plurality of vias extending between the layers for providing electrical connections between the resistor, the capacitor and the transformer; and
   f) an insulative overglaze located over the resistor and at least partially under the transformer, the insulative overglaze protecting the resistor from contacting the transformer.

2. The power splitter according to claim 1 wherein the substrate is formed from layers of low temperature co-fired ceramic.

3. The power splitter according to claim 1 wherein the transformer has a plurality of windings.

4. The power splitter according to claim 1 wherein the transformer is attached to the substrate using an epoxy.

5. The power splitter according to claim 3, wherein the windings are electrically connected to the terminals by a plurality of welds.

6. The power splitter according to claim 1 wherein the substrate is connected to a printed circuit board by a reflowed solder paste attached to the conductive pads on the bottom layer.

7. The power splitter according to claim 1 wherein the capacitor has one electrode formed on one of the inner layers and another electrode formed on another one of the inner layers.

8. The power splitter according to claim 1 wherein at least two of the power splitters are cascaded.

9. The power splitter according to claim 1 wherein two power splitters are cascaded to form a 4-way power splitter.

10. The power splitter according to claim 1 wherein four power splitters are cascaded to form a 8-way power splitter.

11. A power splitter for providing impedance matching and dividing, the power splitter having an input port and a first and second output port, the power splitter comprising:
    a) a multi-layered low temperature co-fired ceramic substrate, the substrate having a top surface and a bottom surface;
    b) a plurality of terminals located on the top surface;
    c) a binocular core transformer attached to the top surface, the transformer having a first leg, a second leg, a third leg and a first winding wound around the first leg and a second winding wound around the third leg, each of the windings having ends connected to the terminals;
    d) a plurality of vias extending through the substrate for providing an electrical connection between the terminals and the bottom surface;
    e) a resistor formed on the top surface and located at least partially under the transformer and electrically connected between the first and second output ports;
    f) a capacitor formed within the sudstrate and electrically connected by the vias between the transformer and a ground connection; and
    g) an insulative overglaze located over the resistor and under the transformer, the insulative overglaze preventing the transformer from contacting the resistor.

12. The power splitter according to claim 11 wherein the transformer is attached to the substrate using an epoxy.

13. The power splitter according to claim 11 wherein the windings are electrically connected to the terminals by a plurality of welds.

14. The power splitter according to claim 11 wherein the substrate is connected to a printed circuit board by a reflowed solder paste attached to a conductive pad on the bottom surface.

15. The power splitter according to claim 11 wherein the capacitor is formed by a pair of electrodes having a layer of the low temperature co-fired ceramic there between, the electrodes each connected to a via.

16. The power splitter according to claim 11 wherein at least two of the power splitters are cascaded into a higher order splitter.

17. The power splitter according to claim 11 wherein two power slitters are cascaded to form a 4-way power splitter.

18. The power splitter according to claim 11 wherein four power splitters are cascaded to form a 8-way power splitter.

19. A method of manufacturing a power splitter comprising the steps of:
    a) providing a plurality of layers low temperature co-fired ceramic including a top layer, a bottom layer and a plurality of inner layers;
    b) punching a plurality of holes in the low temperature co-fired ceramic layers;
    c) filling the holes with a conductive material to form a plurality of vias;
    d) screening a resistor and a plurality of terminals onto the top layer and a pair of electrodes onto tow of the inner layers, the electrodes and one of the layers forming a capacitor, screening a ground plane onto one of the inner layers and screening an insulative overglaze over the resistor, the electrodes, resistor, terminals and ground plane connected to at least one of the vias;
    e) stacking the layers;
    f) firing the stacked layers in an oven to form a unitary substrate; and
    g) attaching a transformer having a plurality of wire windings to a top of the unitary substrate over the insulative overglaze; and
    h) welding the wire windings to the terminals such that the wire windings are electrically connected to the resistor, the capacitor and the ground plane.

20. The method according to claim 19 wherein the transformer is attached to the substrate using an adhesive.

21. The method according to claim 19 wherein the transformer has a binocular core, the winding wound around the core so as from an input port and a pair of output ports.

22. The method according to claim 19 wherein the substrate is attached to a printed circuit board, further comprising the steps of:
    a) screening a solder paste onto a bottom surface conductive pad;
    b) placing the substrate onto the printed circuit board; and
    c) reflowing the solder paste such that the substrate is attached to the printed circuit board.

* * * * *